(12) United States Patent
Klingberg et al.

(10) Patent No.: US 6,242,903 B1
(45) Date of Patent: Jun. 5, 2001

(54) METHOD FOR USING AN INSULATED ELECTRICAL PROBE

(75) Inventors: Gunnar Carl Klingberg, Svanesund (SE); Dave Cook, Tyne & Wear (GB)

(73) Assignee: Sagab Electronic AB (SE)

( * ) Notice: Subject to any disclaimer, the term of this patent is extended or adjusted under 35 U.S.C. 154(b) by 0 days.

(21) Appl. No.: 09/333,782

(22) Filed: Jun. 15, 1999

Related U.S. Application Data

(63) Continuation-in-part of application No. 09/183,006, filed on Oct. 29, 1998.

(51) Int. Cl.[7] .............................. G01R 1/06; G01R 19/14; G01R 31/02
(52) U.S. Cl. ..................... 324/149; 324/133; 324/72.5
(58) Field of Search .................... 324/133, 72.5, 324/66, 67, 326, 149

(56) References Cited

U.S. PATENT DOCUMENTS

| | | |
|---|---|---|
| 2,790,144 | 4/1957 | Sicho ................................ 324/72.5 |
| 3,919,631 | 11/1975 | Brown ................................ 324/51 |
| 4,005,362 | 1/1977 | Fortino ................................ 324/51 |
| 4,066,953 | 1/1978 | Gold ................................ 324/123 R |
| 4,084,134 | 4/1978 | Nagano ................................ 324/133 |
| 5,103,165 | * 4/1992 | Sirattz ................................ 324/133 |
| 5,130,638 | * 7/1992 | Furukawa ................................ 324/67 |
| 5,363,045 | 11/1994 | Martin et al. ................................ 324/395 |
| 5,414,345 | 5/1995 | Rogers ................................ 324/72.5 |

* cited by examiner

*Primary Examiner*—Walter E. Snow
(74) *Attorney, Agent, or Firm*—Fasth Law Offices; Rolf Fasth

(57) ABSTRACT

The voltage detection stick comprises an elongate and hollow casing member that has a front and a back. A tip is rotatably and removably attached to the front of the casing member and a sensor is disposed within the casing member for sensing the presence of a voltage when the sensor is positioned adjacent an electrically conductive member. The casing member has an indicator and an integrated circuit entirely disposed within the casing member for receiving a signal from the sensor and transmitting the signal to the indicator. A power source is disposed within the casing member for powering the sensor, the integrated circuit and the indicator.

2 Claims, 2 Drawing Sheets

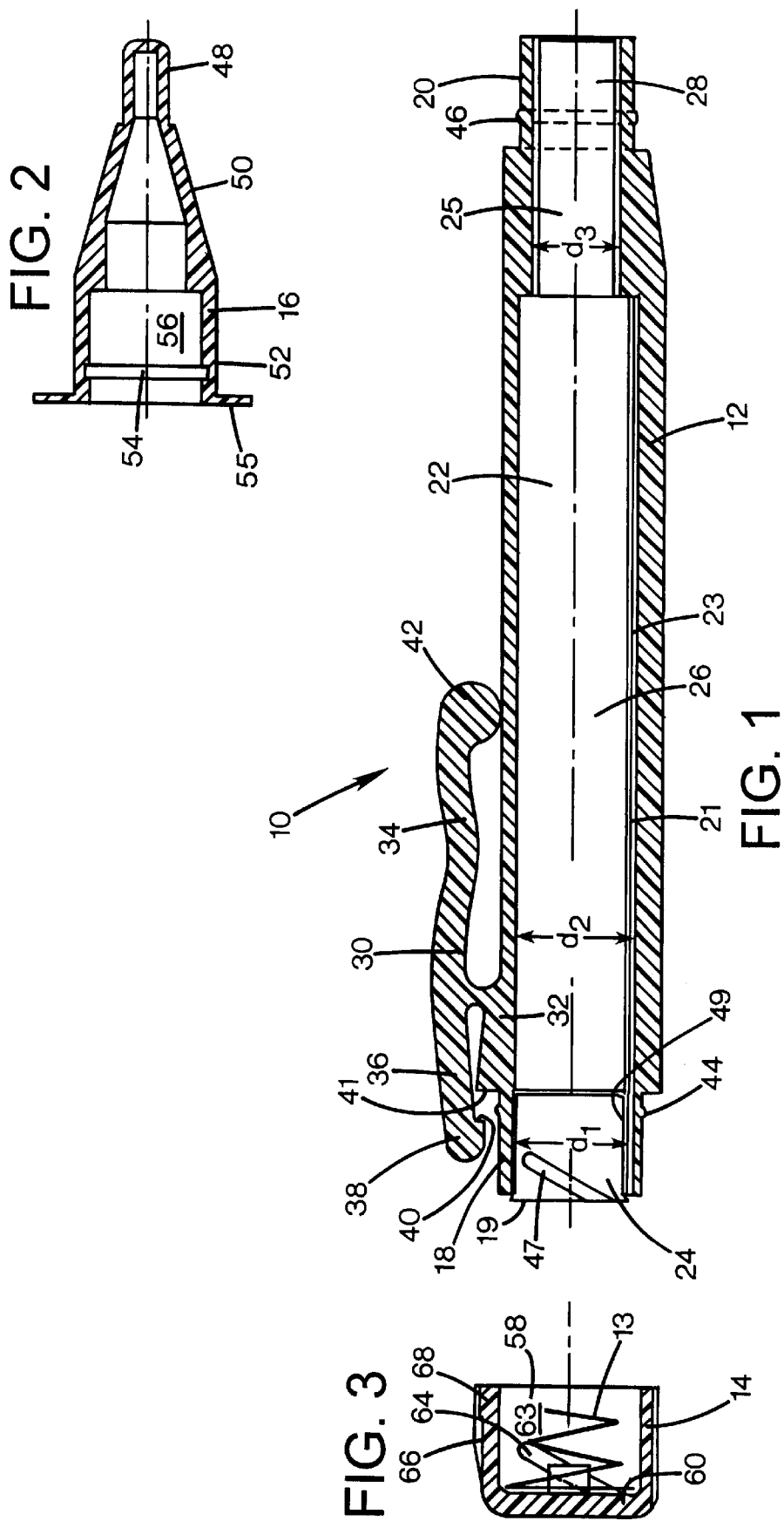

METHOD FOR USING AN INSULATED ELECTRICAL PROBE

PRIOR APPLICATION

This is a continuation-in-part application of U.S. patent application Ser. No. 09/183,006, filed Oct. 29, 1998.

TECHNICAL FIELD

The invention relates to a voltage detection stick for non-contacting detection of voltage.

BACKGROUND INFORMATION AND SUMMARY OF THE INVENTION

Electrical voltage sticks of a contacting or non-contacting type are known in the art. The prior art voltage sticks sometimes include a metal casing that may be coated with an electrically insulative material. One drawback of the prior art voltage sticks is that a scratch in the nonconducting coating on the metal casing may cause a harmful shock if a naked wire is inadvertently contacted.

Another drawback of the prior art voltage sticks is that they sometimes have sensors and integrated circuits disposed within a probe tip that is bonded to the stick. This often makes the voltage stick unnecessarily fragile and relatively difficult to repair.

The voltage stick of the present invention comprises an elongate and hollow casing member that has a front and a back. A rotatable and removable front tip is attached to the front of the casing member and a sensor is disposed within the casing member for sensing the presence of a voltage when the sensor is positioned adjacent an electrically conductive member. The casing member has an indicator and an integrated circuit entirely disposed within the casing member for better protection. The integrated circuit is adapted to receive a signal from the sensor and transmitting the signal to the indicator. A power source is disposed within the casing member for powering the sensor, the integrated circuit and the indicator. Because the tip is rotatable and removable, an operator may access the inside of the casing member by carefully removing the removable tip.

BRIEF DESCRIPTION OF THE DRAWINGS

FIG. 1 is a cross-sectional side view of a casing of the volt detection stick of the present invention;

FIG. 2 is a cross-sectional side view of a probe tip of the volt detection stick of the present invention;

FIG. 3 is a cross-sectional side view of a battery cap of the volt detection stick of the present invention.

DETAILED DESCRIPTION

Figure 4:
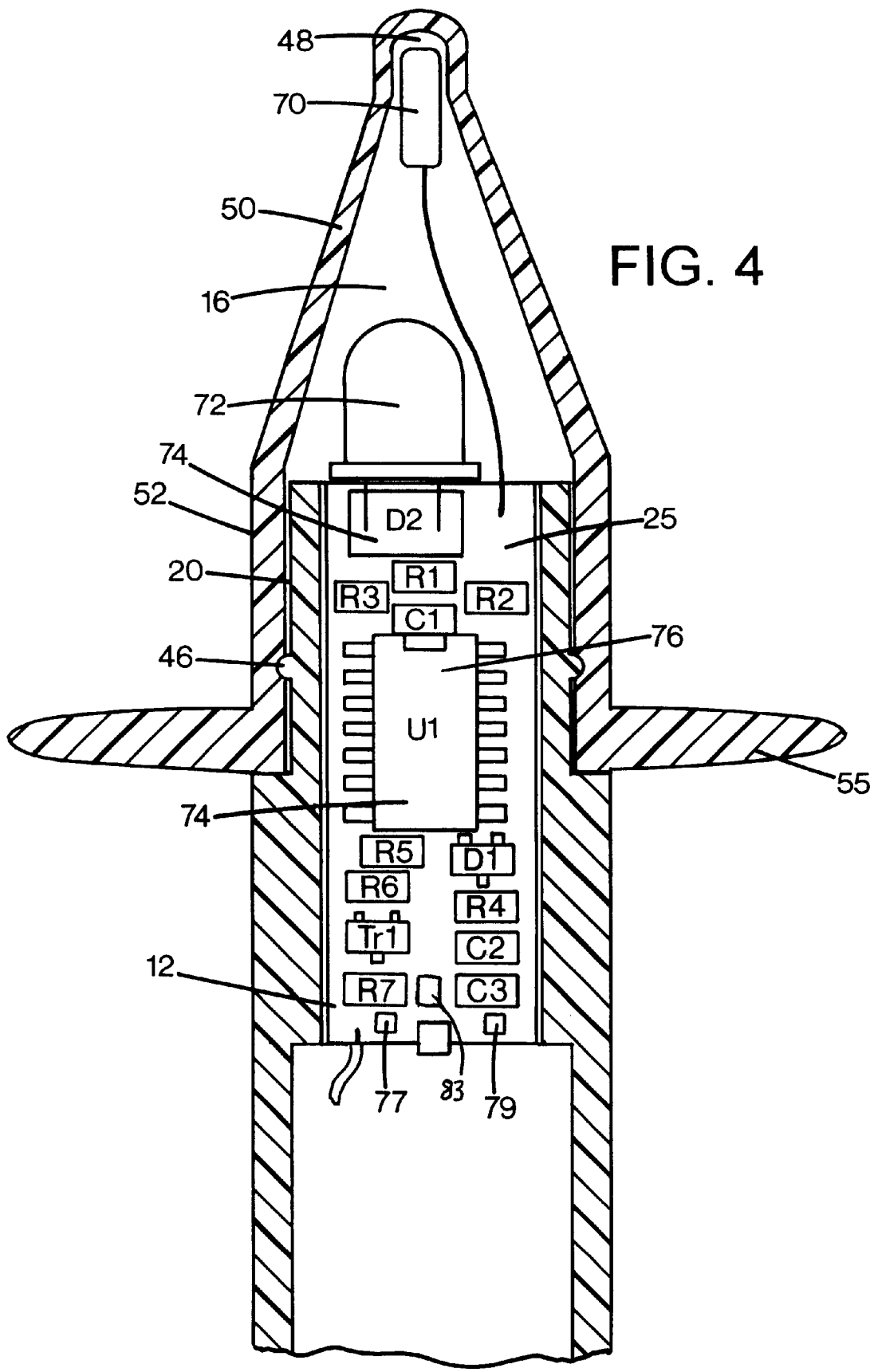
FIG. 4 is a schematic view of the circuit board of the volt detection stick of the present invention.

With reference to FIGS. 1–4, the voltage probe 10 of the present invention comprises a casing 12, a battery cap 14 and a rotatable and removable probe tip 16 so that the battery cap 14 may be attached to a rear end 18 of the casing 12 and the probe tip 16 may be removably attached to an opposite front end 20 of the casing 12. The battery cap 14 may be screwed onto the casing 12 and removed from the casing 12 by unscrewing the cap 14.

The casing 12 is preferably an elongate hollow member having a channel 22 extending therethrough. The hollow member is preferably made of a polymeric material such as polypropylene. Polypropylene provides good electrical insulation and is durable. A rear section 24 of the channel 22 has a first inner diameter d1 and a middle section 26 has a second inner diameter d2 and a front section 28 has a third inner diameter d3 wherein the first diameter d1 is greater than the second diameter d2 that in turn is greater than the third diameter d3. The middle section 26 has a length that is dimensioned to hold two AAA sized batteries and the second inner diameter d2 is dimensioned to receive and hold such batteries.

A spring biased pocket clip 30 is, preferably, integrally formed with a side wall 32 of the casing 12 adjacent the rear end 18 thereof. The clip 30 has a pocket holder 34 and a cap holder 36. The pocket holder 34 extends in a direction that is opposite to the cap holder 36. The cap holder 36 has an enlarged outer portion 38 including a perpendicular flat clamp surface 40. Similarly, the pocket holder 34 has an enlarged tip 42 that bears against the outer surface of the casing 12.

The rear end 18 has a circumferential protrusion 44 that extends radially outwardly all around the rear end 18. Similarly, the front end 20 has a circumferential protrusion 46 that extends radially outwardly all around the front end 20. A helical groove 47 is defined in an inner wall 49 of the rear end 18. The helical groove 47 extends at an obtuse angle relative to the longitudinal axis of the casing 12. A metal sleeve 19 is disposed in the rear end 18. A groove 21 defined inside the casing 12 extends from the rear end 18 along an inner wall of the middle section 26 to the front section 28. A conductive member such as a metal member 23, which could be made of copper, is disposed in the groove 21 so that there is an electrical contact between the metal sleeve 19 and a circuit board 25 disposed in the front section 28 of the casing 12. The circuit board 25 is attached to the casing 12. The metal sleeve 19 connects the printed circuit board, the insulated copper member and the batteries.

The tip 16 has a narrow tip portion 48 and conical shaped mid-section 50 and a cylindrical rear portion 52. The tip 16 is rotatable about the casing 12 and may be removed by, for example, snapping it lose with a screw driver. The removable tip 16 is particularly useful if it is desirable to remove or repair a component disposed inside the casing 12. For example, the operator may carefully remove the tip 16 by carefully using a tool such as a screw driver to snap off the tip from the casing 12. The tip 16 is also rotatable. The tip 16 is substantially hollow and the tip portion 48 is closed while the rear portion 52 is open. A circumferential groove 54 is defined in an inner wall 56 of the tip adjacent the rear portion 50. The inner wall 56 has an inner diameter that is adapted to snugly fit over the front end 20 so that the circumferential protrusion 46 may snap into the circumferential groove 54 when the front portion 20 is fully inserted into the tip 16. The rear portion 52 has a circumferential protrusion 55 that extends radially outwardly. The protrusion 55 provides extra safety and prevent the hand of the operator from slipping forwardly into the area where the voltage is measured. It is to be noted that the tip 16 is not glued to the casing 12 but is only firmly snapped onto the front portion 20. Preferably, the tip 16 is made of a polymeric material such as sicoamide-6 or any other suitable material. The tip 16 has the conical shape to permit easy probing into U.S. style sockets.

The battery cap 14 has an open end 58 and a closed bottom end 60. The cap 14 has an inner wall 62 including a slanted protrusion 64 that extends at an obtuse angle from the bottom end 60. An outer wall 66 includes a flange 68 at an outer end of the cap 14. The open end 58 has an inner diameter that is adapted to snugly receive the rear end 18 so that the flange 68 may snap in behind the clamp surface 40 and the protrusion 44 bears against the inner wall 62. In this way, the flange 68 is tightly held between the clamp surface 40 and a flat surface 41 of the side wall 32. A special feature is that the slanted protrusion 64 may engage the helical cavity 47 when the cap 14 is twisted onto the rear end 18 until the cap 14 is fully fastened to the casing 12. The cap 14 may be removed by turning the cap 14 in the opposite rotational direction so that the protrusion 64 is moved out of the helical cavity 47 and the cap 14 is disengaged from the casing 12. A helical spring member 13 is disposed and attached within the cap 14. The spring member 13 extends inwardly so that it comes into contact with a battery when the cap is screwed onto the casing 12.

As mentioned above, the printed circuit board 25 is, preferably, entirely mounted to and disposed inside the front section 28 to protect the board 25 from external damage and to reduce the weight of the components disposed within the tip 16. Preferably, the circuit board 25 is made of a polymeric material such as a glass-fiber reinforced epoxy resin. Other suitable materials may also be used. As best shown in FIG. 4, the circuit board 25 has an antenna 70 attached thereto that may be made of 22 swg tinned copper wire when the voltage to be detected is in the range of about 110 volts. When the voltage to be detected is about 220 volts then a CR25 carbon resistor (¼ watts) is preferably used. The antenna 70 is the only component that extends into the tip 16 for increased sensitivity. This makes the tip 16 very light in weight and easy to precisely position next to voltage sources.

An indicator or light source 72 such as a surface mounted light emitting diode (led) or a 3 millimeter 700 mcd red led is also attached to the circuit board 25 and may be used to indicate that a voltage has been detected. For example, the led may be made by Citizen or any other suitable manufacturer. Light emitting diodes are the preferred type of light source because they provide a high intensity at a relatively low current. The light source 72 provides sufficient illumination so that the light emitted from the light source 72 may be seen through the tip 16.

An integrated circuit 76 is attached to the circuit board 25. In the preferred embodiment, the integrated circuit 76 is a 74HC14 integrated circuit. It is to be understood that any suitable integrated circuit may be used.

A sensor 74 is disposed on the in ra circuit 76. In the preferred embodiment, a C'Mos I.C. Logic gate sensor is used. The sensor 74 may be adapted to detect a voltage between a live and a neutral two core cable. Preferably, it is designed to detect voltage ranging between about 90–130 V AC on 60 Hz alternating currents (AC). This means that the sensor may detect measurements below 90 V and measurements above 130 V but the volt stick may not be able to distinguish between the live and the neutral cord. The sensor 74 is extremely sensitive and does not require much current to activate the indicator 72. To ensure that the sensor 74 has a more distinct sensitivity level, the sensor 74 may be connected to a resistor such as a resistor R1 of about 300 Mohm for the U.S. version. The European version of the resistor R1 is preferably about 155 Mohm. When the signal reaches about 1–1.5 volt, the integrated circuit may be switched over via a schmittrigger switch circuit.

The integrated circuit 76 may also include filters 77, 79 that may be used to remove static electricity so that the voltage probe is only detecting alternating voltage. For example, the filter 77 may be set to prevent undesirable activation of the volt stick when the frequency is below about 20 Hertz (Hz), more preferably below 10 Hz, or when only conventional direct current is flowing through the wires. By not removing the static electricity, the indicator 72 may turn on as soon as any static electricity is detected by the antenna 70 such as by moving the volt stick through static fields in the air. The filter 79 may be set to require at least three frequency cycles (50–60 Hz) to trigger an activation signal in the volt stick. More preferably, the filter 79 may be set to require at least five frequency cycles. This prevents any unnecessary blinking of the indicator 72 due to incoming transient signals. The filter 79 may also include a signal extending device 81 so that the indicator 72 is lit longer than the signal detected. The device 81 ensures that even very short signals that are detected are clearly indicated in the indicator 72.

An audible sound source, such as a buzzer 83 may be in operative engagement with the circuit board 25 so that the user will hear a clear sound when the buzzer 83 is activated. The buzzer 83 may be attached to an underside of the circuit board 25. Preferably, the buzzer 83 is activated as the same time as the indicator 72 is activated.

While the present invention has been described in accordance with preferred compositions and embodiments, it is to be understood that certain substitutions and alterations may be made thereto without departing from the spirit and scope of the following claims.

We claim:

1. A method of replacing a circuit board disposed in an insulated electrical probe, comprising:

providing an elongate and hollow casing member, a tip rotatably attached to the casing member, a sensor disposed within the casing member for sensing the presence of a voltage when the sensor is positioned adjacent an electrically conductive member, an indicator disposed within the casing member, an integrated circuit disposed within the casing member, a first filter attached to the integrated circuit and a power source disposed within the casing member for powering the sensor, the indicator and a first integrated circuit;

positioning the sensor adjacent an electrically conductive member;

the sensor sensing a voltage of the electrically conductive member;

the sensor transmitting a detection signal to the first filter;

the first filter receiving the detection signal from the sensor;

the first filter transmitting the detection signal to the indicator when the detected voltage has a frequency that is greater than about 10 Hertz;

disengaging a circumferential radial protrusion of the casing member from a circumferential groove defined inside the rotatable tip and removing the tip from the casing member;

removing the circuit board disposed inside the casing member;

installing a second circuit board into the casing member, the second circuit board having a second filter;

positioning the sensor adjacent the electrically conductive member;

the sensor sensing a voltage of the electrically conductive member;

the sensor transmitting a second detection signal to the second filter;

the second filter receiving the second detection signal from the sensor;

the second filter transmitting the second detection signal to the indicator when the detected voltage has a frequency that is greater than about 20 Hertz; and terminating the detection signal when the detected voltage has a frequency that is less than about 20 Hertz.

2. The method according to claim 1 wherein the method further comprises providing a time sensitive filter connected to the second filter, the second filter transmitting the detection signal to the time sensitive filter when the detected voltage has a frequency that is greater than about 20 Hertz, the time sensitive filter receiving the detection signal from the second filter, the time sensitive filter transmitting the detection signal to the indicator when the voltage detected is at least about five frequency cycles long.

* * * * *